US012672508B2

(12) United States Patent
Shao

(10) Patent No.: US 12,672,508 B2
(45) Date of Patent: Jun. 30, 2026

(54) DEVICE FOR TAKING MATERIALS AFTER CUTTING OF ENCAPSULATED FINISHED PRODUCTS BASED ON REULEAUX POLYGONS

(71) Applicant: SHENZHEN SIPTORY TECHNOLOGY CO., LTD, Shenzhen (CN)

(72) Inventor: Dongdong Shao, Shenzhen (CN)

(73) Assignee: SHENZHEN SIPTORY TECHNOLOGY CO., LTD, Shenzhen (CN)

( * ) Notice: Subject to any disclaimer, the term of this patent is extended or adjusted under 35 U.S.C. 154(b) by 85 days.

(21) Appl. No.: 18/940,921

(22) Filed: Nov. 8, 2024

(65) Prior Publication Data

US 2025/0069917 A1 Feb. 27, 2025

Related U.S. Application Data

(63) Continuation of application No. PCT/CN2023/087729, filed on Apr. 12, 2023.

(30) Foreign Application Priority Data

May 17, 2022 (CN) .......................... 202210534013.1

(51) Int. Cl.
*H10P 72/00* (2026.01)
(52) U.S. Cl.
CPC ................................ *H10P 72/0442* (2026.01)
(58) Field of Classification Search
CPC .... B65B 27/32; H10P 72/0442; H10P 872/37; B26D 7/32
See application file for complete search history.

(56) References Cited

U.S. PATENT DOCUMENTS

| | | | | |
|---|---|---|---|---|
| 4,002,270 A | * | 1/1977 | Reiner | B65G 27/32 |
| | | | | 198/572 |
| 2003/0127302 A1 | * | 7/2003 | Brewer | B65G 47/72 |
| | | | | 198/436 |
| 2019/0295859 A1 | * | 9/2019 | Kim | H10W 74/01 |

FOREIGN PATENT DOCUMENTS

| | | | | | |
|---|---|---|---|---|---|
| CA | 1116192 A | * | 1/1982 | ............. | B65G 47/24 |
| CN | 104600008 A | * | 5/2015 | .......... | H10P 72/0441 |
| CN | 107871684 A | * | 4/2018 | ............. | H10W 74/15 |

(Continued)

OTHER PUBLICATIONS

Machine translation SE358135B (Year: 1973).*

(Continued)

*Primary Examiner* — Abbas Rashid
*Assistant Examiner* — Ayne K. Swier

(57) ABSTRACT

The present invention discloses a device for taking materials after cutting of encapsulated finished products based on Reuleaux polygons. A first reference track, a first carrying track, and an encapsulated finished product loading structure are arranged from bottom to top in sequence, and the distance between every two of them is constant. When the encapsulated finished products, which are still adhered to the cutting film after cutting, are placed upside down on the encapsulated finished product loading structure, the encapsulated finished products drop off under the knocking action of the first central vertical push-pull rod and fall into the bulk material carrying tray, which can realize automated material taking at a low cost.

17 Claims, 4 Drawing Sheets

(56)     References Cited

FOREIGN PATENT DOCUMENTS

| DE | 4446619 | A1 | * | 6/1996 | ............. | B65H 29/46 |
| EP | 0157331 | A2 | * | 10/1985 | ............. | B65G 27/32 |
| SE | 358135 | B | * | 7/1973 | ............. | B65G 57/04 |
| WO | WO-2015063231 | A2 | * | 5/2015 | ............. | A23L 19/18 |

OTHER PUBLICATIONS

Machine translation DE444619A1 (Year: 1996).*
Machine translation CN104600008A (Year: 2015).*
Machine translation CN107871684A (Year: 2018).*

* cited by examiner

Reuleaux
triangle

Reuleaux
pentangle

Reuleaux
septangle

DEVICE FOR TAKING MATERIALS AFTER CUTTING OF ENCAPSULATED FINISHED PRODUCTS BASED ON REULEAUX POLYGONS

CROSS REFERENCE TO RELATED APPLICATIONS

The present application is a Continuation Application of PCT Application No. PCT/CN2023/087729 filed on Apr. 12, 2023, which claims the benefit of Chinese Patent Application No. 202210534013.1 filed on May 17, 2022. All the above are hereby incorporated by reference in their entirety.

TECHNICAL FIELD

This invention relates to the field of encapsulating technology, specifically to a device for taking materials after cutting of encapsulated finished products based on Reuleaux polygons.

BACKGROUND ART

In the field of semiconductor packaging, the back-end processing includes a series of processes such as cutting, testing, taping, and electrical testing of encapsulated products.

Encapsulation typically involves grouping multiple encapsulated products into a single unit for encapsulation. For example, there might be 10 encapsulated finished products in one unit. After wire bonding and injection molding are completed, the finished products need to be cut. The cutting of finished products is the first process in the back-end processing. Subsequent electrical testing and tape processing can be carried out only after realization of bulk material molding of the encapsulated finished products.

After current encapsulated finished products have undergone filming and cutting, the encapsulated finished products have become separate from each other. However, the film is in a semi-cut state, so the encapsulated finished products are still adhered to the film and need to be removed from the film one by one. Currently, there are two methods of "removing" in the industry: one method involves removing the cut products from the cutting film using an automatic threshing machine, but it requires the purchase of specialized equipment which is costly; the other method involves manually picking the cut bulk materials, which is not only prone to damaging the cut products but also consumes manpower and resources.

SUMMARY OF THE INVENTION

Embodiments of the present invention provide a device for taking materials after cutting of encapsulated finished products based on Reuleaux polygons, which improves the material taking speed of the encapsulated finished products after cutting and reduces the cost of the equipment.

A device for taking materials after cutting of encapsulated finished products based on Reuleaux polygons, including: a first reference track, a first carrying track, an encapsulated finished product loading structure after cutting, a first Reuleaux polygon mechanism, and a bulk material carrying tray;

The first reference track, the first carrying track, and the encapsulated finished product loading structure are arranged from bottom to top in sequence, and the distance between the first reference track, the first carrying track and the encapsulated finished product loading structure is constant;

The bulk material carrying tray is provided above the first carrying track, and the bulk material carrying tray is provided below the encapsulated finished product loading structure;

The first Reuleaux polygon mechanism includes a first central vertical push-pull rod and rolls forward on the first reference track. During the rolling process, the upper vertex of the first Reuleaux polygon mechanism presses against the lower part of the first carrying track. The top end of the first central vertical push-pull rod fluctuates up and down to make a pushing and pulling action, or a knocking action, while moving forward;

When the encapsulated finished products, which are still adhered to the cutting film after cutting, are placed upside down on the encapsulated finished product loading structure, each encapsulated finished product drops off under the knocking action of the first central vertical push-pull rod and falls into the bulk material carrying tray.

Preferably, the first Reuleaux polygon mechanism is a trilateral Reuleaux polygon mechanism;

Let the extension direction of the first reference track be the x-axis, and the vertical direction be the y-axis; in the initial state, the left bottom vertex of the trilateral Reuleaux polygon mechanism be the origin, the median point of the trilateral Reuleaux polygon mechanism be M, the side length of the equilateral triangle enveloped by the side length of the Reuleaux triangle be r, the line connecting M with the upper corner vertex of the front half of the trilateral Reuleaux polygon mechanism be r1, and the vertical line from the upper corner vertex of the front half of the trilateral Reuleaux polygon mechanism to the x-axis be r2, the angle between r1 and r2 be $\varphi$, then the coordinate formula for M is:

$$x = r\varphi - \frac{\sqrt{3}}{3} r \sin \varphi$$

$$y = r - \frac{\sqrt{3}}{3} r \cos\varphi \ (0 \le \varphi \le \pi/6)$$

Preferably, the distance between the first reference track, the first carrying track and the encapsulated finished product loading structure is adjustable.

Preferably, the horizontal moving speed of the first Reuleaux polygon mechanism is adjustable, with the horizontal moving speed of the first Reuleaux polygon mechanism being achieved by adjusting the rolling forward speed.

The number of sides of the first Reuleaux polygon mechanism is any one of 3, 4, 5, . . . N, N being a natural number.

Preferably, the number of the first Reuleaux polygon mechanism is two or more, and the two or more first Reuleaux polygon mechanisms have different numbers of sides. Replacing the first Reuleaux polygon mechanisms with different numbers of sides can obtain different knocking strengths and knocking frequencies, which are equivalent to the vibration frequencies and vibration amplitudes for the encapsulated finished products.

The horizontal moving speed is adjustable, and the number of the first Reuleaux polygon mechanisms to be two or more is realized by adjusting the rolling forward speed of the horizontal moving speed of the first Reuleaux polygon mechanisms.

For different sizes of cut products and different viscosities of cutting films, for one thing, different vibration frequencies are achieved by altering the horizontal moving speed of the bottom Reuleaux polygon mechanism; and for another, different vibration amplitudes are realized by selecting different Reuleaux polygon shapes (i.e., changing r or φ). The process parameters are flexible, with a wide range of applications.

Preferably, a carrying tray guide frame is further included, the upper end of which is set at the rear side of the upper end of the first central vertical push-pull rod, and the lower end of which is set at the upper part of the bulk material carrying tray. The carrying tray guide frame has an arc-shaped track structure extending from the upper right to the lower left, and is pulled forward by the first central vertical push-pull rod.

Preferably, a second reference track, a second carrying track, and a second Reuleaux polygon mechanism are also included.

The second reference track, the second carrying track, and the encapsulated finished product loading structure are arranged from top to bottom in sequence, and the distance between the second reference track, the second carrying track, and the encapsulated finished product loading structure is constant;

The second Reuleaux polygon mechanism includes a second central vertical push-pull rod and rolls forward on the second carrying track. During the rolling process, the upper vertex of the second Reuleaux polygon mechanism presses against the lower part of the second reference track. The lower end of the second central vertical push-pull rod fluctuates up and down to make a pushing and pulling action, or a knocking action, while moving forward;

When the encapsulated finished products, which are still adhered to the cutting film after cutting, are placed upside down on the encapsulated finished product loading structure, each encapsulated finished product drops off under the knocking action of the second central vertical push-pull rod and falls into the bulk material carrying tray.

Preferably, the first central vertical push-pull rod and the second central vertical push-pull rod collaboratively knock the encapsulated finished products, which are still adhered to the cutting film after cutting, placed upside down on the encapsulated finished product loading structure.

Preferably, the collaborative knocking includes any one of the following collaborative methods:

The first central vertical push-pull rod and the second central vertical push-pull rod simultaneously knock different parts of the same encapsulated finished product; the first central vertical push-pull rod pushes upward on a certain part of the encapsulated finished product, while the second central vertical push-pull rod pushes downward on another part of the encapsulated finished product; or, The first central vertical push-pull rod and the second central vertical push-pull rod simultaneously knock different parts of the same encapsulated finished product; the first central vertical push-pull rod pushes downward on a certain part of the encapsulated finished product, while the second central vertical push-pull rod pushes upward on another part of the encapsulated finished product; or, The first central vertical push-pull rod and the second central vertical push-pull rod take turns to knock the same part of the same encapsulated finished product; the first central vertical push-pull rod pushes upward on the rear half of the encapsulated finished product first, and then the second central vertical push-pull rod pushes downward on the same area of the encapsulated finished product.

Preferably, the first Reuleaux polygon mechanism and the second Reuleaux polygon mechanism have the same or different numbers of sides.

The first Reuleaux polygon mechanism and the second Reuleaux polygon mechanism can be set to roll forward and backward (until the encapsulated finished product is dropped and then moves to another position).

Preferably, a bidirectional guide arm in the shape of a funnel is provided at the upper end of the carrying tray guide frame, so that the encapsulated finished product is carried well no matter whether it is dropped under the action of the first central vertical push-pull rod or the second central vertical push-pull rod.

The beneficial effects of the present invention are: a device for taking materials after cutting of encapsulated finished products based on Reuleaux polygons, including: a first reference track, a first carrying track, an encapsulated finished product loading structure after cutting, a first Reuleaux polygon mechanism, and a bulk material carrying tray; the first reference track, the first carrying track, and the encapsulated finished product loading structure are arranged from bottom to top in sequence, and the distance between the first reference track, the first carrying track and the encapsulated finished product loading structure is constant; the bulk material carrying tray is provided above the first carrying track, and the bulk material carrying tray is provided below the encapsulated finished product loading structure; the first Reuleaux polygon mechanism includes a first central vertical push-pull rod and rolls forward on the first reference track, and during the rolling process, the upper vertex of the first Reuleaux polygon mechanism presses against the lower part of the first carrying track; the first Reuleaux polygon mechanism has a fixed width; taking the first reference track as the reference surface and the first carrying track as the carrying surface, the positions of the reference surface and the carrying surface are fixed, and the distance H between the reference surface and the carrying surface is a constant distance, as shown in FIG. 2; during the rolling process of the first Reuleaux polygon mechanism, its geometric center, also known as the median point, undergoes a regular up and down movement; the first central vertical push-pull rod, which is mounted on the geometric center, also follows this regular up and down movement; the upper vertex of the first central vertical push-pull rod fluctuates, and the top end of the first central vertical push-pull rod performs a pushing and pulling action, or knocking action, while moving forward, as shown in FIG. 3; this achieves the required vibration (the up and down fluctuation of the top end of the first central vertical push-pull rod) for de-filming and pick-up of the cut bulk materials by the relative movement (rolling forward) of the Reuleaux polygon against the horizontal surfaces (reference surfaces); when the encapsulated finished products, which are still adhered to the cutting film after cutting, are placed upside down on the encapsulated finished product loading structure, each encapsulated finished product drops off under the knocking action of the first central vertical push-pull rod and falls into the bulk material carrying tray. The device has a simple structure, a low cost, can realize automated material taking, avoids manual operation, improves the material taking speed of the encapsulated finished products after cutting and reduces the cost of the equipment.

DESCRIPTION OF DRAWINGS

To provide a clearer description of the technical solutions in the examples of the present invention, a brief introduction to the drawings required in the description of the examples is given below. Obviously, the drawings described below are only some examples of the present invention. For those ordinarily skilled in the art, other drawings can also be obtained based on these drawings without inventive efforts.

In the figures.

Figures 1, 2:
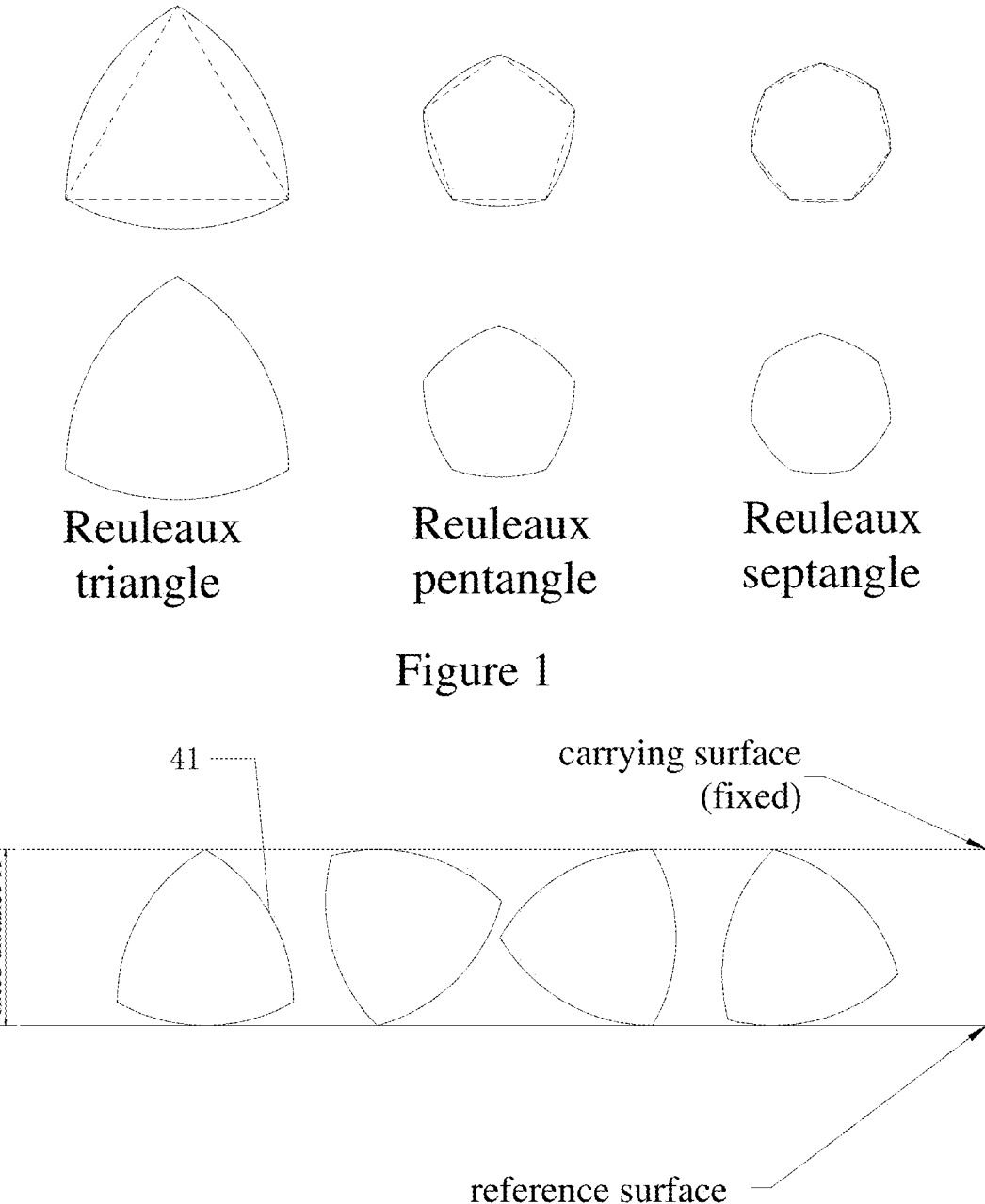
FIG. 1 is a schematic diagram of the Reuleaux triangle (Reuleaux triagon), Reuleaux pentangle (Reuleaux pentagon), and Reuleaux septangle (Reuleaux heptagon).
FIG. 2 is a schematic diagram of the rolling forward process of the Reuleaux triangle mechanism.
Figure 3:
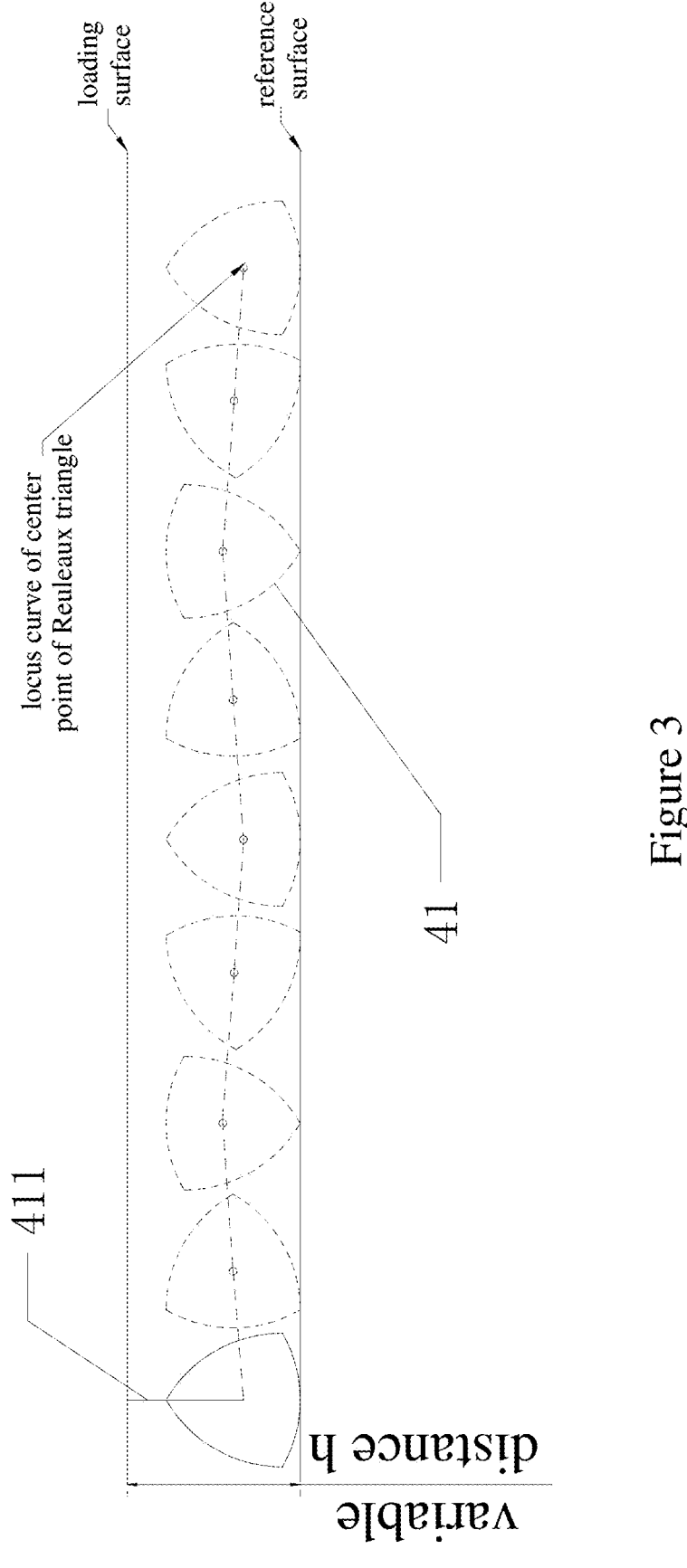
FIG. 3 is a schematic diagram of the movement trajectory of the geometric center during the rolling forward process of the Reuleaux triangle mechanism.
Figure 4:
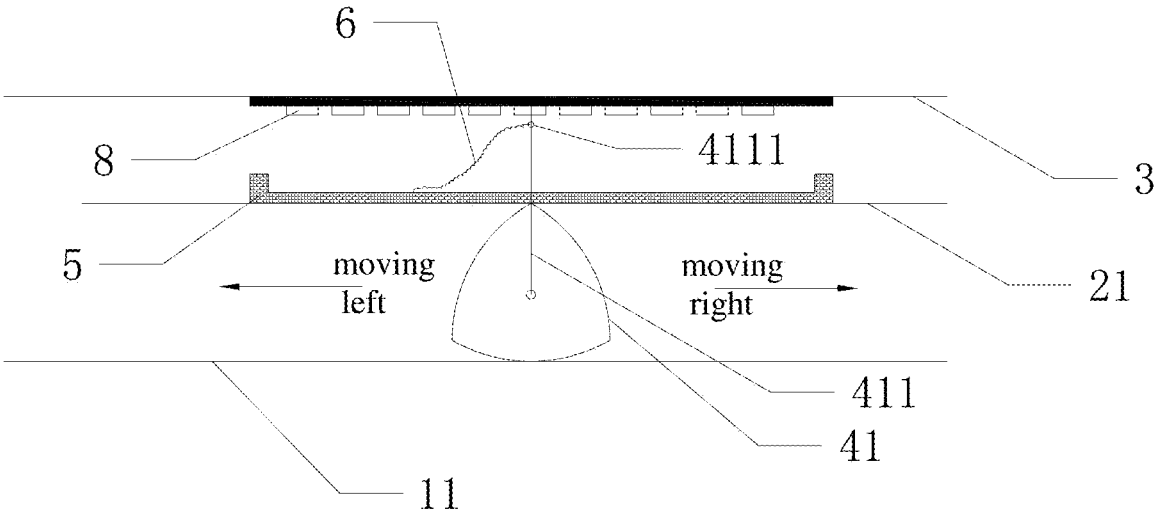
FIG. 4 is a schematic diagram of Example 1 for a device for taking materials after cutting of encapsulated finished products based on Reuleaux polygons in the present invention.
Figure 5:
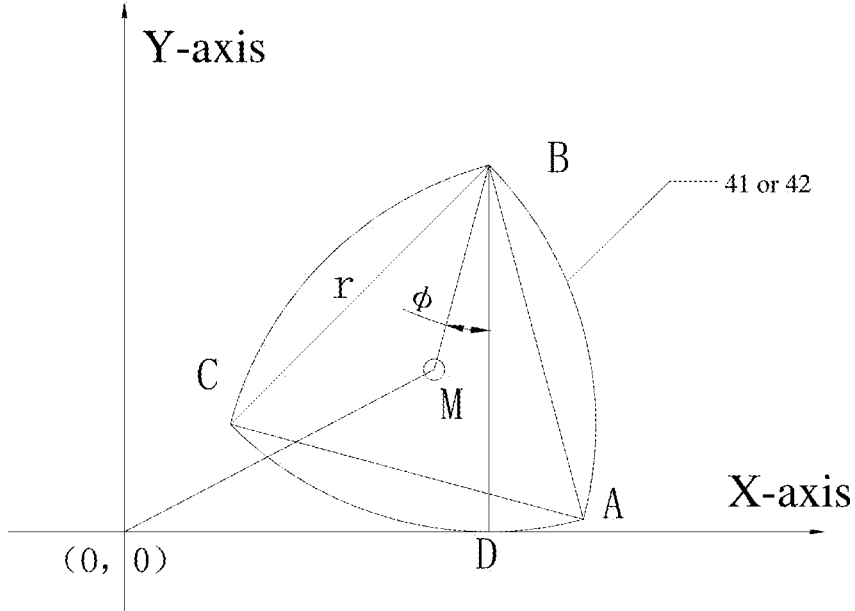
FIG. 5 is a schematic diagram showing the coordinate of the geometric center point M of a Reuleaux triangle mechanism in Example 1 for a device for taking materials after cutting of encapsulated finished products based on Reuleaux polygons in the present invention.

11—a first reference track; 12—a second reference track; 21—a first carrying track; 22—a second carrying track; 3—an encapsulated finished product loading structure; 41—a first Reuleaux polygon mechanism; 411—a first central vertical push-pull rod; 4111—a socket ring; 42—a second Reuleaux polygon mechanism; 421—a second central vertical push—pull rod; 5—a bulk material carrying tray; 6—a carrying tray guide frame; 8—an encapsulated finished product.

DETAILED DESCRIPTION OF THE INVENTION

Examples of the present invention provide a device for taking materials after cutting of encapsulated finished products based on Reuleaux polygons, for solving current problems of high stress of lead frames and easy occurrence of microcracks.

A clear and complete description of the technical solutions in the examples of the present invention is provided below by combining with FIGS. 1-7 in the examples of the present invention. Obviously, the described examples are only a part of the examples of the present invention, rather than all of them. Based on the examples in the present invention, the other examples obtained by those skilled in the art without inventive efforts all fall within the protection scope of the present invention.

The terms "first", "second", "third", "fourth", etc., if any, in the description, claims and the above drawings of the present invention are used to distinguish similar objects and need not be used to describe a particular order or sequence. It should be understood that the data so used are interchangeable under appropriate circumstances so that the examples described herein can be implemented in an order other than what is illustrated or described herein. In addition, the terms "includes" and "has", and any variations thereof, are intended to cover non-exclusive inclusion. For instance, a process, method, system, product, or equipment that comprises a series of steps or units need not be limited to those clearly listed steps or units, but may include other steps or units that are not clearly listed or are inherent to those processes, methods, products, or equipment.

By referring to the drawings, the present invention provides in the examples a detailed introduction to a device for taking materials after cutting of encapsulated finished products based on Reuleaux polygons.

Example 1

By referring to FIGS. 1-5, the specific process of the example is as follows:

A device for taking materials after cutting of encapsulated finished products based on Reuleaux polygons, including: a first reference track 11, a first carrying track 21, an encapsulated finished product loading structure after cutting 3, a first Reuleaux polygon mechanism 41, and a bulk material carrying tray 5;

The first reference track 11, the first carrying track 21, and the encapsulated finished product loading structure 3 are arranged from bottom to top in sequence, and the distance between the first reference track 11, the first carrying track 21 and the encapsulated finished product loading structure 3 is constant;

The bulk material carrying tray 5 is provided above the first carrying track 21, and the bulk material carrying tray 5 is provided below the encapsulated finished product loading structure 3;

The first Reuleaux polygon mechanism 41 includes a first central vertical push-pull rod 411 and rolls forward on the first reference track 11. During the rolling process, the upper vertex of the first Reuleaux polygon mechanism 41 presses against the lower part of the first carrying track 21. The top end of the first central vertical push-pull rod 411 fluctuates up and down to make a pushing and pulling action, or a knocking action, while moving forward;

When the encapsulated finished products 8, which are still adhered to the cutting film after cutting, are placed upside down on the encapsulated finished product loading structure 3, each encapsulated finished product 8 drops off under the knocking action of the first central vertical push-pull rod 411 and falls into the bulk material carrying tray 5.

Characteristics of the Reuleaux triangle (Reuleaux triagon): by placing a graph between two parallel lines to make it tangent to both, it is possible to achieve: no matter how the graph moves, as long as it is within these two parallel lines, it will always remain tangent to them, but the center point will form a circle.

In the example, the first Reuleaux polygon mechanism 41 is a trilateral Reuleaux polygon mechanism;

Let the extension direction of the first reference track 11 be the x-axis, and the vertical direction be the y-axis; in the initial state, the left bottom vertex of the trilateral Reuleaux polygon mechanism be the origin, the median point of the trilateral Reuleaux polygon mechanism be M, the side length of the equilateral triangle enveloped by the side length of the Reuleaux triangle be r, the line connecting M with the upper corner vertex of the front half of the trilateral Reuleaux polygon mechanism be r1, and the vertical line from the upper corner vertex of the front half of the trilateral Reuleaux polygon mechanism to the x-axis be r2, the angle between r1 and r2 be φ, then the coordinate formula for M is:

$$x = r\varphi - \frac{\sqrt{3}}{3} r \sin \varphi$$

$$y = r - \frac{\sqrt{3}}{3} r \cos \varphi \, (0 \le \varphi \le \pi/6)$$

In the example, the distance between the first reference track 11, the first carrying track 21 and the encapsulated finished product loading structure 3 is adjustable.

In the example, the horizontal moving speed of the first Reuleaux polygon mechanism 41 is adjustable, with the horizontal moving speed of the first Reuleaux polygon mechanism 41 being achieved by adjusting the rolling forward speed.

The number of sides of the first Reuleaux polygon mechanism 41 is any one of 3, 4, 5, . . . N, N being a natural number.

In the example, the number of the first Reuleaux polygon mechanism 41 is two or more, and the two or more first Reuleaux polygon mechanisms 41 have different numbers of sides. Replacing the first Reuleaux polygon mechanisms 41 with different numbers of sides can obtain different knocking strengths and knocking frequencies, which are equivalent to the vibration frequencies and vibration amplitudes for the encapsulated finished products 8.

The horizontal moving speed is adjustable, and the number of the first Reuleaux polygon mechanisms 41 to be two or more is realized by adjusting the rolling forward speed of the horizontal moving speed of the first Reuleaux polygon mechanisms 41.

For different sizes of cut products and different viscosities of cutting films, for one thing, different vibration frequencies are achieved by altering the horizontal moving speed of the bottom Reuleaux polygon mechanism; and for another, different vibration amplitudes are realized by selecting different Reuleaux polygon shapes (i.e., changing r or φ). The process parameters are flexible, with a wide range of applications.

In the example, a carrying tray guide frame 6 is further included, the upper end of which is set at the rear side of the upper end of the first central vertical push-pull rod 411, and the lower end of which is set at the upper part of the bulk material carrying tray 5. The carrying tray guide frame 6 has an arc-shaped track structure extending from the upper right to the lower left, and is pulled forward by the first central vertical push-pull rod 411.

In the example, the first central vertical push-pull rod 411 is fitted with a socket ring 4111 that can slide up and down. The upper part of the carrying tray guide frame 6 is connected to the socket ring 4111. The first central vertical push-pull rod 411 does not exert a driving force on the carrying tray guide frame 6 when moving up and down, but generates a driving force for the forward and backward movement of the carrying tray guide frame 6 when moving forward and backward, thereby achieving accurate guidance of the dropped encapsulated finished products 8.

The technical problem to be solved by the present invention is to develop a device for taking materials after cutting of encapsulated finished products based on Reuleaux polygons, which can be used to quickly, conveniently, and at a low cost address the demolding (de-filming) and pick-up of bulk materials of the encapsulated finished product after cutting. It has a low cost, flexible design, and a wide range of applications.

The technical solutions adopted in the present invention are:

(1) Providing a reference surface for the material taking vibration structure;

(2) Providing a left and right movable mechanism above the reference surface, and designing the mechanism as a Reuleaux polygon (taking Reuleaux triangle as an example);

(3) Providing a carrying surface above the movable mechanism, ensuring fixed positions of the reference surface and carrying surface using the fixed width characteristic of the Reuleaux polygon;

(4) Providing a loading surface at an appropriate position above the carrying surface, wherein the loading surface is loaded with the cut but non-demolded cut product, and the top end of the first central vertical push-pull rod 411 of the Reuleaux polygon mechanism can knock the lower end of the cut product;

Completing the above material taking vibration structure design, and realizing the material taking vibration structure after cutting of the encapsulated finished product;

Placing the cut encapsulated finished product with the cutting film upside down on the loading surface above the material taking mechanism, and placing a bulk material carrying tray on the loading surface; for different sizes of cut products and different viscosities of cutting films, for one thing, achieving different vibration frequencies by altering the horizontal moving speed of the bottom Reuleaux polygon mechanism, and for another, realizing different vibration amplitudes by selecting different Reuleaux polygon shapes (i.e., changing r or φ).

Example 2 with Reference to FIGS. 1-3, 5 and 6

A device for taking materials after cutting of encapsulated finished products based on Reuleaux polygons, including: a first reference track 11, a first carrying track 21, an encapsulated finished product loading structure after cutting 3, a first Reuleaux polygon mechanism 41, and a bulk material carrying tray 5;

The first reference track 11, the first carrying track 21, and the encapsulated finished product loading structure 3 are arranged from bottom to top in sequence, and the distance between the first reference track 11, the first carrying track 21 and the encapsulated finished product loading structure 3 is constant;

The bulk material carrying tray 5 is provided above the first carrying track 21, and the bulk material carrying tray 5 is provided below the encapsulated finished product loading structure 3;

The first Reuleaux polygon mechanism 41 includes a first central vertical push-pull rod 411 and rolls forward on the first reference track 11. During the rolling process, the upper vertex of the first Reuleaux polygon mechanism 41 presses against the lower part of the first carrying track 21. The top end of the first central vertical push-pull rod 411 fluctuates up and down to make a pushing and pulling action, or a knocking action, while moving forward;

When the encapsulated finished products 8, which are still adhered to the cutting film after cutting, are placed upside down on the encapsulated finished product loading structure 3, each encapsulated finished product 8 drops off under the knocking action of the first central vertical push-pull rod 411 and falls into the bulk material carrying tray 5.

Figure 6:
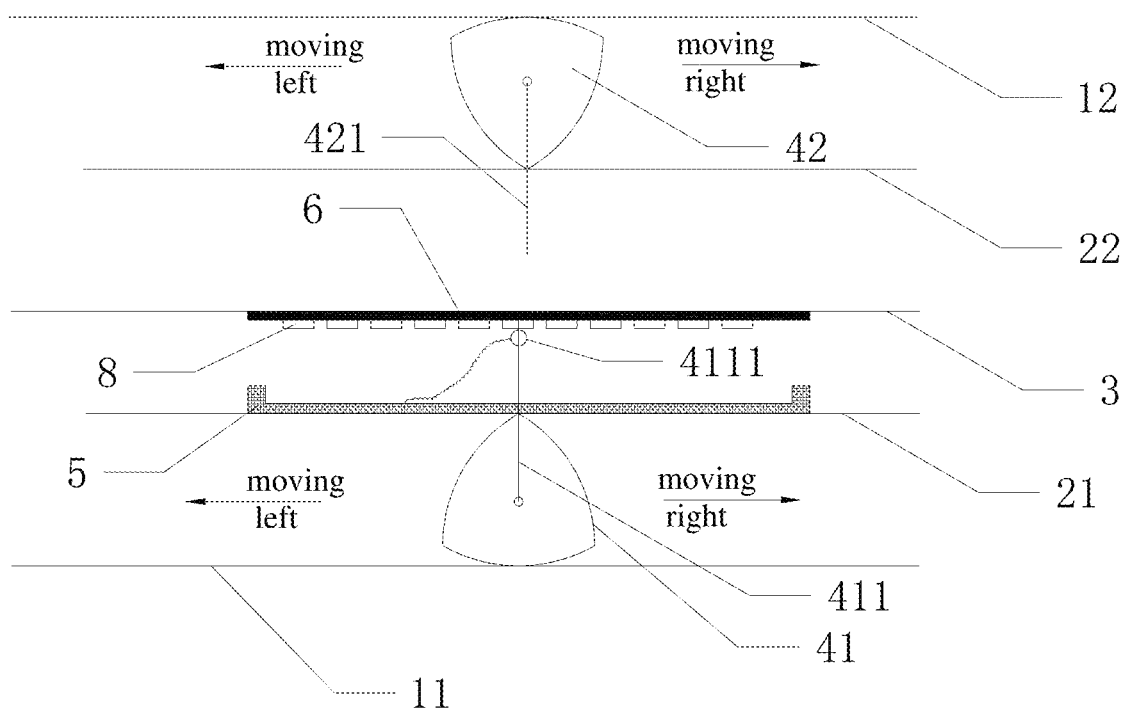
FIG. 6 is a schematic diagram of Example 2 for a device for taking materials after cutting of encapsulated finished products based on Reuleaux polygons in the present invention.
Figure 7:
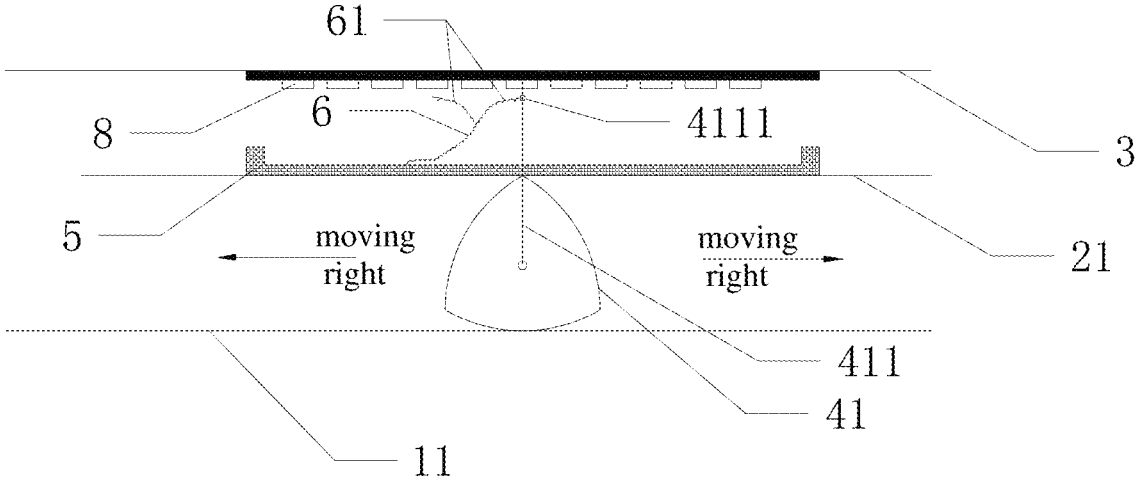
FIG. 7 is a schematic diagram of Example 3 for a device for taking materials after cutting of encapsulated finished products based on Reuleaux polygons in the present invention.

The parts that are not described in this example are the same or substantially the same as example 1. Reference is made to FIG. 6.

The example further includes: a second reference track 12, a second carrying track 22, and a second Reuleaux polygon mechanism 42; the second reference track 12, the second carrying track 22, and the encapsulated finished product loading structure 3 are arranged from top to bottom in sequence, and the distance between the second reference track 12, the second carrying track 22, and the encapsulated finished product loading structure 3 is constant; the second Reuleaux polygon mechanism 42 includes a second central vertical push-pull rod 421 and rolls forward on the second carrying track 22; during the rolling process, the upper vertex of the second Reuleaux polygon mechanism 42 presses against the lower part of the second reference track 12; the lower end of the second central vertical push-pull rod 421 fluctuates up and down to make a pushing and pulling action, or a knocking action, while moving forward; when the encapsulated finished products 8, which are still adhered to the cutting film after cutting, are placed upside down on the encapsulated finished product loading structure 3, each encapsulated finished product 8 drops off under the knocking action of the second central vertical push-pull rod 421 and falls into the bulk material carrying tray 5.

In the example, the first central vertical push-pull rod 411 and the second central vertical push-pull rod 421 collaboratively knock the encapsulated finished products 8, which are still adhered to the cutting film after cutting, placed upside down on the encapsulated finished product loading structure 3. By arranging the upper and lower knocking structures, the encapsulated finished product can be knocked down from the cutting film more efficiently and conveniently.

In the example, the collaborative knocking includes any one or a combination of two or more of the following collaborative methods:

The first central vertical push-pull rod 411 and the second central vertical push-pull rod 421 simultaneously knock different parts of the same encapsulated finished product 8; the first central vertical push-pull rod 411 pushes upward on a certain part of the encapsulated finished product 8, while the second central vertical push-pull rod 421 pushes downward on another part of the encapsulated finished product 8; or, The first central vertical push-pull rod 411 and the second central vertical push-pull rod 421 simultaneously knock different parts of the same encapsulated finished product 8; the first central vertical push-pull rod 411 pushes downward on a certain part of the encapsulated finished product 8, while the second central vertical push-pull rod 421 pushes upward on another part of the encapsulated finished product 8; or, The first central vertical push-pull rod 411 and the second central vertical push-pull rod 421 take turns to knock the same part of the same encapsulated finished product 8; the first central vertical push-pull rod 411 pushes upward on the rear half of the encapsulated finished product 8 first, and then the second central vertical push-pull rod 421 pushes downward on the same area of the encapsulated finished product 8.

The collaborative method of the first central vertical push-pull rod 411 and the second central vertical push-pull rod 421 can also adopt other suitable knocking methods through computer simulation.

The top end of the first central vertical push-pull rod 411 can be equipped with a flexible knocking capsule to avoid causing destructive effects on the encapsulated finished product 8.

In the example, the first Reuleaux polygon mechanism 41 and the second Reuleaux polygon mechanism 42 have the same or different numbers of sides.

The first Reuleaux polygon mechanism 41 and the second Reuleaux polygon mechanism 42 can be set to roll forward and backward (until the encapsulated finished product 8 is dropped and then moves to another position).

Example 3

The parts that are not described in this example are the same or substantially the same as example 2. Reference is made to FIGS. 1-3, 5 and 7.

In the example, a bidirectional guide arm 61 in the shape of a funnel or playing the role of a funnel is provided at the upper end of the carrying tray guide frame 6, so that the encapsulated finished product 8 is carried well no matter whether it is dropped under the action of the first central vertical push-pull rod 411 or the second central vertical push-pull rod 421.

The technical problem to be solved by the present invention is to develop a device for taking materials after cutting of encapsulated finished products based on Reuleaux polygons, which can be used to quickly, conveniently, and at a low cost address the demolding and pick-up of bulk materials of the encapsulated finished product after cutting. It has a low cost, flexible design, and a wide range of applications:

1. Low cost: at present, after filming and cutting of the encapsulated finished product, one method involves removing the cut products from the cutting film using an automatic threshing machine, but it requires the purchase of specialized equipment which is costly; another method involves manually picking the cut bulk materials, which is not only prone to damaging the cut products but also consumes manpower and resources. The present invention is simple in design and the cost is greatly reduced.

2. Flexible design: for different sizes of cut products and different viscosities of cutting films, for one thing, different vibration frequencies are achieved by altering the horizontal moving speed of the bottom Reuleaux polygon mechanism; and for another, different vibration amplitudes are realized by selecting different Reuleaux polygon shapes (i.e., changing r or φ). The process parameters are flexible, with a wide range of applications.

The above examples are only used to illustrate the technical solutions of the present invention, not to limit them; although the present invention has been described in detail with reference to the foregoing examples, those ordinarily skilled in the art should understand that they can still make amendments to the technical solutions recited in the foregoing examples or make equivalent replacements for some of the technical features therein; and such amendments or replacements do not detach the essence of the corresponding technical solutions from the spirit and scope of the technical solutions of the examples in the present invention.

What is claimed:

1. A device for taking materials after cutting of encapsulated finished products based on Reuleaux polygons, characterized in including: a first reference track, a first carrying track, an encapsulated finished product loading structure after cutting, a first Reuleaux polygon mechanism, and a bulk material carrying tray;

wherein the first reference track, the first carrying track, and the encapsulated finished product loading structure are arranged from bottom to top in sequence, and the distance between the first reference track, the first carrying track and the encapsulated finished product loading structure is constant;

wherein the bulk material carrying tray is provided above the first carrying track, and the bulk material carrying tray is provided below the encapsulated finished product loading structure;

wherein the first Reuleaux polygon mechanism includes a first central vertical push-pull rod and rolls forward on the first reference track, and during the rolling process, the upper vertex of the first Reuleaux polygon mechanism presses against the lower part of the first carrying track, and the top end of the first central vertical push-pull rod fluctuates up and down to make a pushing and pulling action, or a knocking action, while moving forward; and wherein when the encapsulated finished products, which are still adhered to a cutting film after cutting, are placed upside down on the encapsulated finished product loading structure, each encapsulated finished product drops off under knocking action of the first central vertical push-pull rod and falls into the bulk material carrying tray.

2. The device for taking materials after cutting of encapsulated finished products based on Reuleaux polygons according to claim 1, characterized in that the first Reuleaux polygon mechanism is a trilateral Reuleaux polygon mechanism;

wherein let the extension direction of the first reference track be the x-axis, and the vertical direction be the y-axis; in the initial state, the left bottom vertex of the trilateral Reuleaux polygon mechanism be the origin, the median point of the trilateral Reuleaux polygon mechanism be M, the side length of the equilateral triangle enveloped by the side length of the Reuleaux triangle be r, the line connecting M with the upper corner vertex of the front half of the trilateral Reuleaux polygon mechanism be r1, and the vertical line from the upper corner vertex of the front half of the trilateral Reuleaux polygon mechanism to the x-axis be r2, the angle between r1 and r2 be $\varphi$, then the coordinate formula for M is:

$$x = r\varphi - \frac{\sqrt{3}}{3} r \sin\varphi$$

$$y = r - \frac{\sqrt{3}}{3} r\cos\varphi \ (0 \le \varphi \le \pi/6).$$

3. The device for taking materials after cutting of encapsulated finished products based on Reuleaux polygons according to claim 1, characterized in that the distance between the first reference track, the first carrying track and the encapsulated finished product loading structure is adjustable.

4. The device for taking materials after cutting of encapsulated finished products based on Reuleaux polygons according to claim 1, characterized in that the horizontal moving speed of the first Reuleaux polygon mechanism is adjustable.

5. The device for taking materials after cutting of encapsulated finished products based on Reuleaux polygons according to claim 4, characterized in that the horizontal moving speed of the first Reuleaux polygon mechanism is achieved by adjusting the rolling forward speed;

wherein the number of sides of the first Reuleaux polygon mechanism is any one of 3, 4, 5, . . . N, N being a natural number.

6. The device for taking materials after cutting of encapsulated finished products based on Reuleaux polygons according to claim 5, characterized in that the number of the first Reuleaux polygon mechanism is two or more, and the two or more first Reuleaux polygon mechanisms have different numbers of sides, wherein replacing first Reuleaux polygon mechanisms with different numbers of sides can obtain different knocking strengths and knocking frequencies, which are equivalent to vibration frequencies and vibration amplitudes for the encapsulated finished products.

7. The device for taking materials after cutting of encapsulated finished products based on Reuleaux polygons according to claim 1, characterized in further including a carrying tray guide frame, the upper end of which is set at the rear side of the upper end of the first central vertical push-pull rod, and the lower end of which is set at the upper part of the bulk material carrying tray, wherein the carrying tray guide frame has an arc-shaped track structure extending from the upper right to the lower left, and is pulled forward by the first central vertical push-pull rod.

8. The device for taking materials after cutting of encapsulated finished products based on Reuleaux polygons according to claim 7, characterized in further including a second reference track, a second carrying track, and a second Reuleaux polygon mechanism;

wherein the second reference track, the second carrying track, and the encapsulated finished product loading structure are arranged from top to bottom in sequence, and the distance between the second reference track, the second carrying track, and the encapsulated finished product loading structure is constant.

9. The device for taking materials after cutting of encapsulated finished products based on Reuleaux polygons according to claim 8, characterized in that, the second Reuleaux polygon mechanism includes a second central vertical push-pull rod and rolls forward on the second carrying track; during the rolling process, the upper vertex of the second Reuleaux polygon mechanism presses against the lower part of the second reference track, and the lower end of the second central vertical push-pull rod fluctuates up and down to make a knocking action while moving forward.

10. The device for taking materials after cutting of encapsulated finished products based on Reuleaux polygons according to claim 9, characterized in that, when the encapsulated finished products, which are still adhered to the cutting film after cutting, are placed upside down on the encapsulated finished product loading structure, each encapsulated finished product drops off under the knocking action of the second central vertical push-pull rod and falls into the bulk material carrying tray.

11. The device for taking materials after cutting of encapsulated finished products based on Reuleaux polygons according to claim 8, characterized in that, the first central vertical push-pull rod and the second central vertical push-pull rod collaboratively knock the encapsulated finished products, which are still adhered to the cutting film after cutting, placed upside down on the encapsulated finished product loading structure.

12. The device for taking materials after cutting of encapsulated finished products based on Reuleaux polygons according to claim 11, characterized in that the collaborative knocking includes:

the first central vertical push-pull rod and the second central vertical push-pull rod simultaneously knocking different parts of the same encapsulated finished product; the first central vertical push-pull rod pushing upward on a certain part of the encapsulated finished product, while the second central vertical push-pull rod pushing downward on another part of the encapsulated finished product.

13. The device for taking materials after cutting of encapsulated finished products based on Reuleaux polygons according to claim 12, characterized in that a bidirectional guide arm in the shape of a funnel is provided at the upper end of the carrying tray guide frame, so that the encapsulated finished product is carried well no matter whether it is dropped under the action of the first central vertical push-pull rod or the second central vertical push-pull rod.

14. The device for taking materials after cutting of encapsulated finished products based on Reuleaux polygons according to claim 13, characterized in that a bidirectional guide arm in the shape of a funnel is provided at the upper end of the carrying tray guide frame, so that the encapsulated finished product is carried well no matter whether it is dropped under the action of the first central vertical push-pull rod or the second central vertical push-pull rod.

15. The device for taking materials after cutting of encapsulated finished products based on Reuleaux polygons according to claim 11, characterized in that the collaborative knocking includes:

the first central vertical push-pull rod and the second central vertical push-pull rod simultaneously knocking different parts of the same encapsulated finished product; the first central vertical push-pull rod pushing downward on a certain part of the encapsulated finished product, while the second central vertical push-pull rod pushing upward on another part of the encapsulated finished product.

16. The device for taking materials after cutting of encapsulated finished products based on Reuleaux polygons according to claim 11, characterized in that the collaborative knocking includes:

the first central vertical push-pull rod and the second central vertical push-pull rod taking turns to knock the same part of the same encapsulated finished product; the first central vertical push-pull rod pushing upward on the rear half of the encapsulated finished product first, and then the second central vertical push-pull rod pushing downward on the same area of the encapsulated finished product.

17. The device for taking materials after cutting of encapsulated finished products based on Reuleaux polygons according to claim 16, characterized in that a bidirectional guide arm in the shape of a funnel is provided at the upper end of the carrying tray guide frame, so that the encapsulated finished product is carried well no matter whether it is dropped under the action of the first central vertical push-pull rod or the second central vertical push-pull rod.

* * * * *